United States Patent
Johnson et al.

(10) Patent No.: US 9,459,280 B2
(45) Date of Patent: Oct. 4, 2016

(54) USING FLUID TO POSITION A DEVICE IN A SOCKET FOR TESTING

(75) Inventors: John C. Johnson, Phoenix, AZ (US); Charles Fulton, Queen Creek, AZ (US); Philip R. Martin, Chandler, AZ (US); Kent M. Carrie, Gilbert, AZ (US)

(73) Assignee: Intel Corporation, Santa Clara, CA (US)

(*) Notice: Subject to any disclaimer, the term of this patent is extended or adjusted under 35 U.S.C. 154(b) by 645 days.

(21) Appl. No.: 13/595,903

(22) Filed: Aug. 27, 2012

(65) Prior Publication Data

US 2014/0055156 A1  Feb. 27, 2014

(51) Int. Cl.
*G01R 31/20* (2006.01)
*G01R 1/04* (2006.01)
*G01R 31/28* (2006.01)

(52) U.S. Cl.
CPC ......... *G01R 1/0433* (2013.01); *G01R 31/2891* (2013.01)

(58) Field of Classification Search
CPC ... F28D 15/00; G01R 31/00; G01R 31/2863; G01R 31/2865; G01R 31/2875; G01R 31/2874; G01R 31/2877; G01R 1/045; G01R 1/0458; G01R 1/0433; G01R 1/0466; G01R 33/3403; G01R 33/3804; G05D 23/1904

USPC ........... 324/750.03, 750.04, 750.06, 750.08, 324/750.09; 165/104.33
See application file for complete search history.

(56) References Cited

U.S. PATENT DOCUMENTS

| | | | |
|---|---|---|---|
| 6,019,166 A | 2/2000 | Viswanath et al. | |
| 6,768,297 B2 | 7/2004 | Johnson et al. | |
| 6,894,523 B2 | 5/2005 | Neeb | |
| 7,715,931 B2 | 5/2010 | Johnson et al. | |
| 2004/0032275 A1* | 2/2004 | Cader et al. | 324/760 |
| 2004/0051545 A1* | 3/2004 | Tilton et al. | 324/760 |
| 2005/0030007 A1* | 2/2005 | Sakata | 324/158.1 |
| 2009/0227125 A1* | 9/2009 | Farris et al. | 439/71 |
| 2010/0141287 A1* | 6/2010 | Scocchetti | 324/755 |

OTHER PUBLICATIONS

International Application No. PCT/US2012/031430, filed Mar. 30, 2012, "entitled Generic Address Scrambler for Memory Circuit Test Engine", by D. Kobla et al., 33 pp.

* cited by examiner

*Primary Examiner* — Son Le
(74) *Attorney, Agent, or Firm* — Konrad Raynes Davda & Victor LLP; Alan S. Raynes

(57) ABSTRACT

Provided are a method and system for using fluid to position a device in a socket for testing. The device is positioned within a socket and a body is coupled to the socket. Fluid is delivered to a chamber defined in part by the body, a first surface of the device to provide pressure onto the device to move the device within the socket.

22 Claims, 7 Drawing Sheets

USING FLUID TO POSITION A DEVICE IN A SOCKET FOR TESTING

RELATED ART

A test unit may be used to test the operations of a device, such as a package substrate and mounted semiconductor die, positioned in a socket. FIG. 1 illustrates a prior art test unit 2 comprised of a body 4 coupled to a thermal unit 6 that is coupled to a semiconductor chip (die) 8 mounted to a package substrate 10. The thermal unit 6 may be coupled to the body 4 with one or more springs. Force is applied to the substrate by bars 12a and 12b that apply mechanical force on a top side of the package substrate 10. This arrangement requires a dedicated area on the package substrate 10 for providing a mechanical foot so the bars 12a, 12b may land and apply a socketing load. The thermal unit 6 contacts a top surface of the die 8.

BRIEF DESCRIPTION OF THE DRAWINGS

Embodiments are described by way of example, with reference to the accompanying drawings, which are not drawn to scale, wherein.

DETAILED DESCRIPTION

Certain embodiments relate to positioning a device in a socket to test the device. Embodiments include both devices and methods. Reference below will be made to the drawings wherein like structures may be provided with like reference designations. In order to show the structures of various embodiments most clearly, the drawings included herein include diagrammatic representations of electronic device and integrated circuit structures. Thus, the actual appearance of the fabricated structures may appear different while still incorporating the claimed structures of the illustrated embodiments. Moreover, the drawings may show only the structures necessary to understand the illustrated embodiments. Additional structures known in the art have not been included to maintain the clarity of the drawings.

Figure 1:
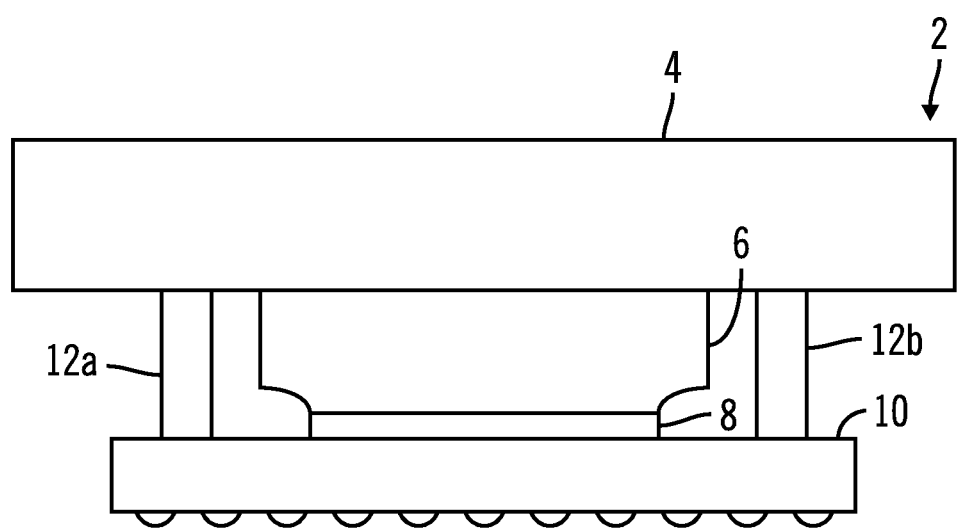
FIG. 1 illustrates an embodiment of a test unit as known in the prior art.

The prior art arrangement of FIG. 1 increases the total package size by requiring a footing for the bars 12a, 12b, which increases the cost of the substrate package 10. Further, the force of the bars 12a, 12b bearing on the surface of the package substrate 10 may damage the package substrate 10 by applying the force over a relatively small area on the package substrate 10.

Described embodiments provide methods and apparatuses to position a device within a socket. Fluid is delivered into a chamber defined in part by a body positioned on the socket and a first surface of the device to provide downward pressure onto the device to move the device within the socket.

Certain described embodiments may evenly distribute a pressure based socketing force onto the device pneumatically or hydraulically, as opposed to mechanically pushing on the device surface with discrete contact force application zones. With certain embodiments, the fluid applies a pressurized force application conformal over an area of the device the fluid contacts, irrespective of the topology to distribute forces evenly. The described embodiments create a pressure differential between a top and bottom of the device to be tested. The device to test is placed into a socket whose design may surround the device with adequate tolerance to a package edge so as to limit fluid leakage to an acceptable amount.

Figure 2:
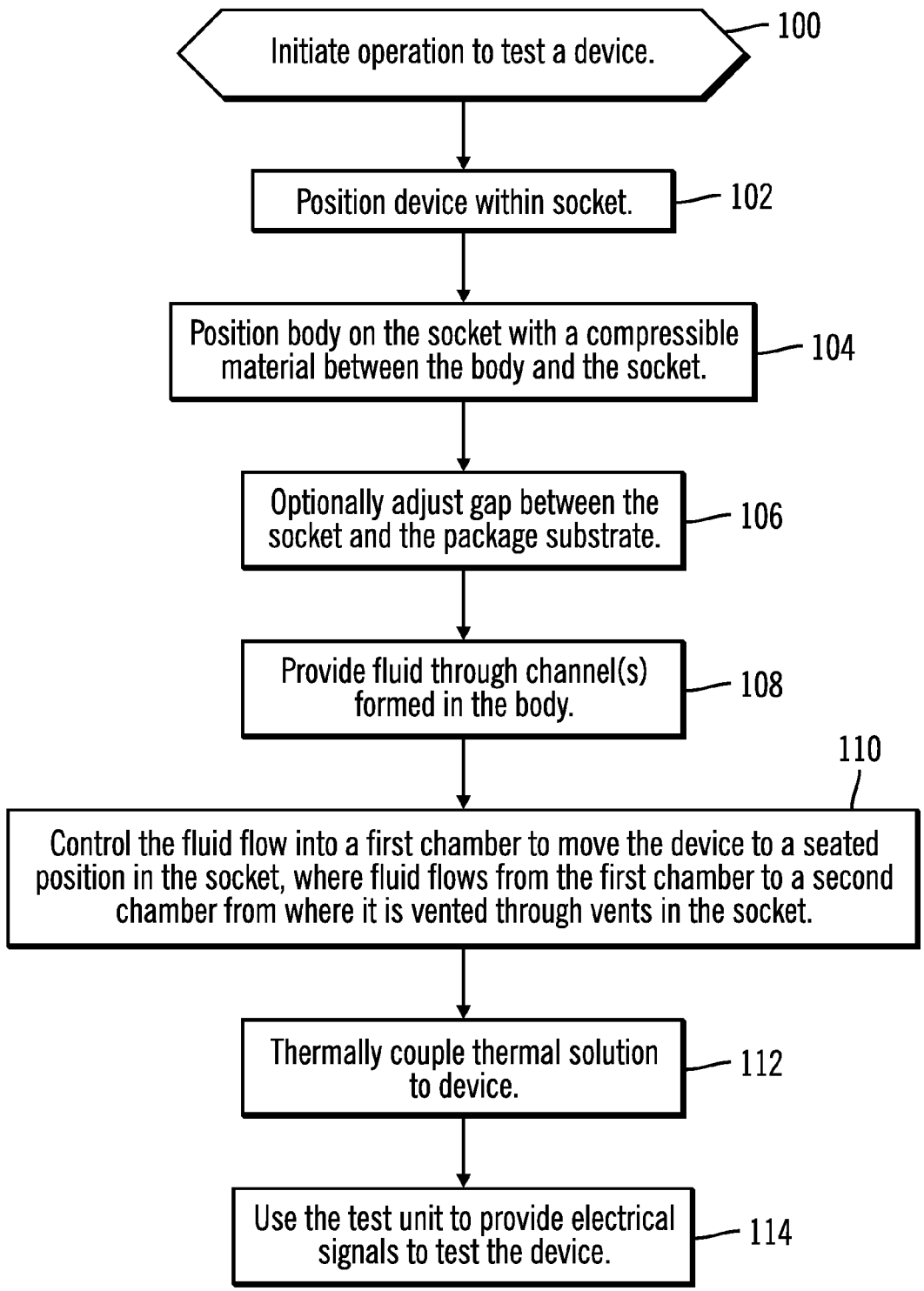
FIGS. 2 and 7 illustrate embodiments of processing operations to use fluid to provide pressure on a device under test.

FIG. 2 illustrates a flow of operations to position a device, e.g., semiconductor chip or die mounted on a substrate, into a test unit for testing in accordance with described embodiments. The operations of FIG. 2 are described with respect to the device testing unit described with respect to FIGS. 3-6.

With respect to FIG. 2, at block 100 the operations to test a device, such as a semiconducting material mounted on a package substrate, with a device testing unit are initiated. The device is mounted in the socket to test the device under a variety of operating conditions, including, for example, different electrical loads and temperatures.

Figure 3:
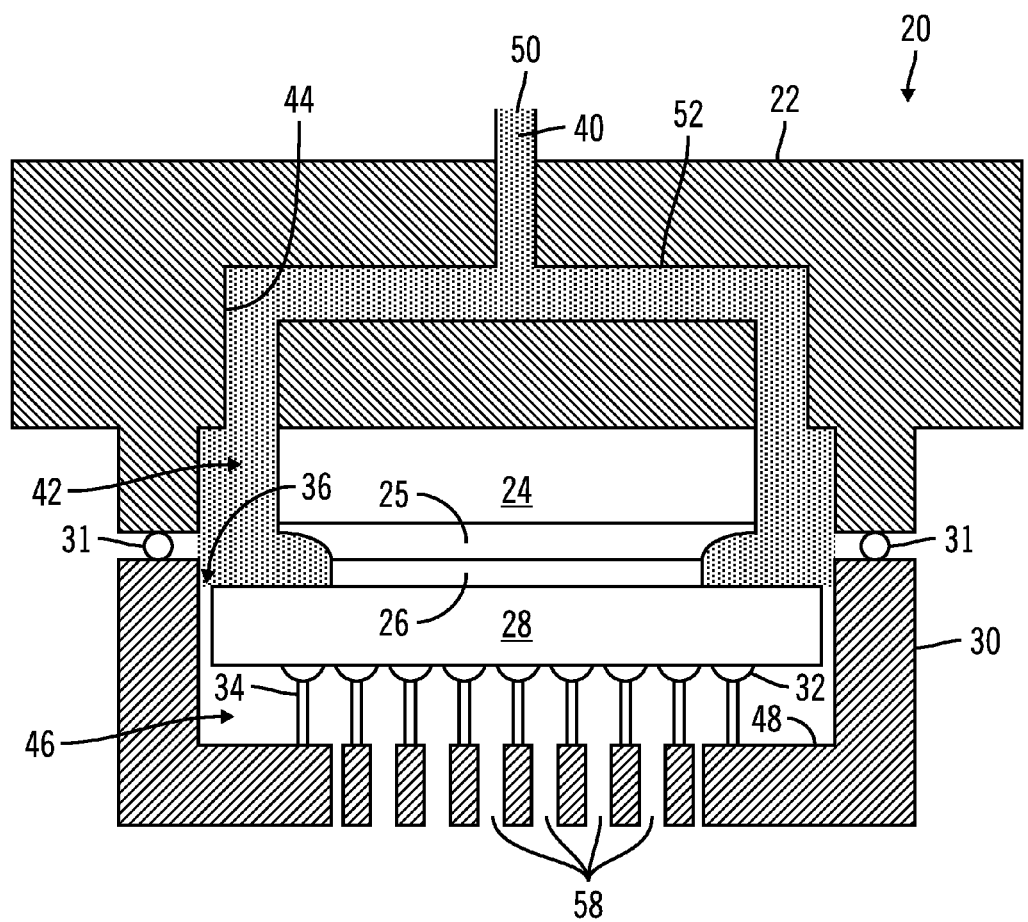
FIGS. 3, 4, 5, 6, and 8 illustrate embodiments of components of a testing unit device and a device.

FIG. 3 shows a cross section of a testing unit 20 to test a device, such as a semiconducting material 26 mounted on a package substrate 28. The testing unit 20 has a body 22, such as a chuck body, coupled to a thermal head 24. The thermal head 24 may comprise a structure such as metal body that has heating and cooling components and structures therein to allow for the heat exchange and temperature control of the device being tested when the device is positioned in the socket. The semiconducting material 26 may be thermally coupled to the thermal head 24.

Further, in certain embodiments, there may be a pedestal portion 25, comprising a solid material separate from the thermal head 24 or integral with the thermal head 24, located at the bottom of the thermal head 24 and positioned between the thermal head 24 and the semiconducting material 26 while the thermal head 24 is thermally coupled to the semiconducting material 26.

At block 102, the device, e.g., package substrate 28 and semiconducting material 26, are positioned within a socket 30. The positioning may allow for a gap 36 around the device, e.g., between the package substrate 28 and inner walls of the socket 30. In certain embodiments, the gap may be 10 mil. For example, where the package substrate 28 comprises a 35×35 mm package, the total gap area may be approximately 0.05 in$^2$ or slightly less than $\frac{1}{16}$ in$^2$.

In certain described embodiments, the device to test, or device under test (DUT), comprises semiconducting material 26 mounted onto a package substrate 28. In alternative embodiments, the DUT may comprise other types of electronic devices to test. In certain embodiments, the DUT may comprise a type of electronic device that is positioned within a socket during normal operations, so that the device testing unit may test the device while positioned in the socket to simulate an environment under various operating conditions.

At block 104, the body 22 is positioned on the socket 30 with a compressible material 31, such as in the shape of an O-ring, positioned between the body 22 and the socket 30 to form an air tight seal.

FIG. 3 also shows that when the device, e.g., package substrate 28, is seated in the socket 30, package electrical contacts 32 on a second (bottom) surface of the package substrate 28 are electrically coupled to socket electrical contacts 34 extending from a bottom portion of the socket 30. In FIG. 2, the package electrical contacts 32 are shown as solder balls or metallic bumps formed on the bottom surface of the package substrate 28. In alternative embodiments, the package electrical contacts 32 may comprise other suitable electrical contact structures known in the art such as contact pins. In FIG. 2, the socket electrical contacts 34 are shown as pins, and may comprise retractable pins that compress as the package electrical contacts 32 provide downward force.

Figure 8:
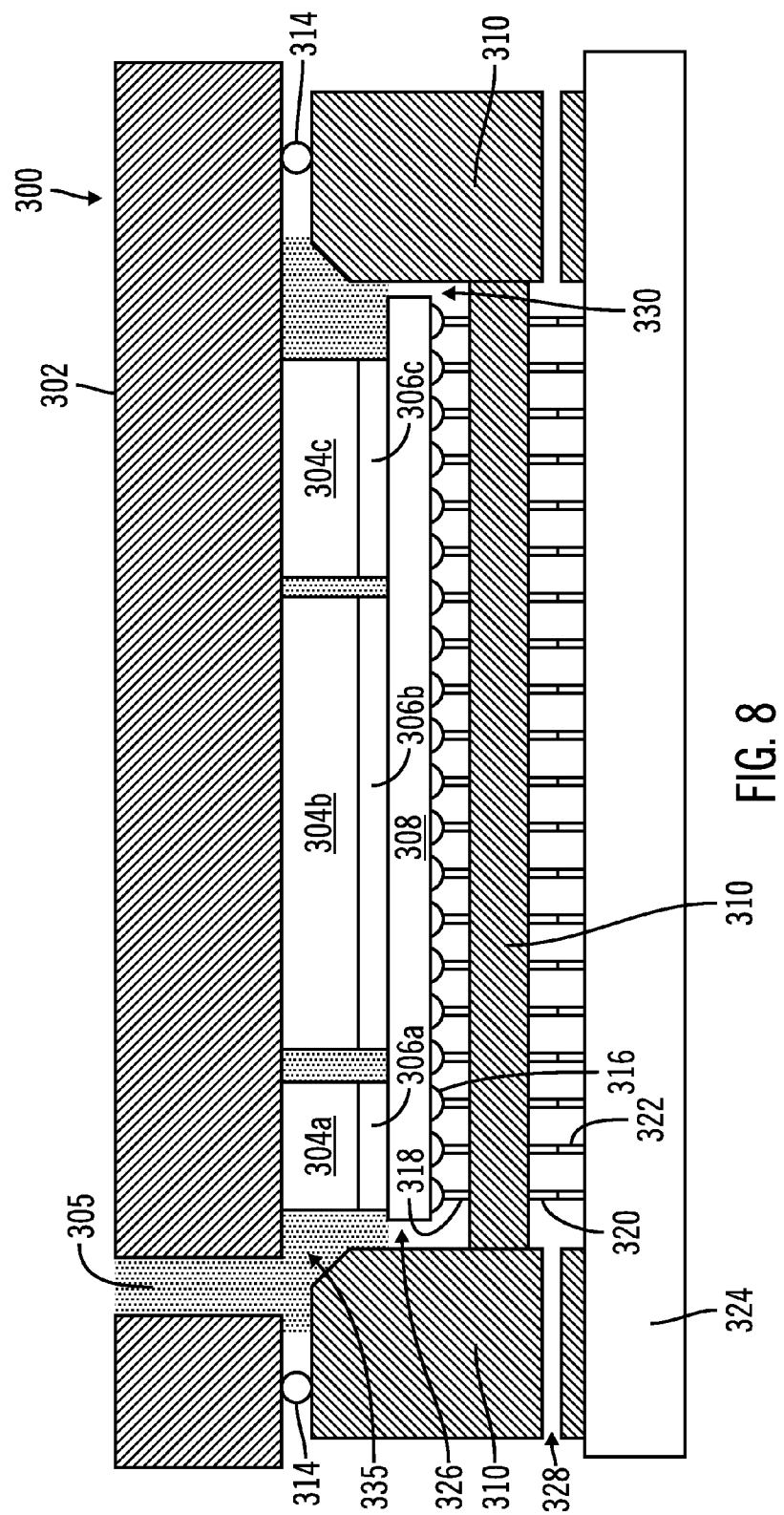

In certain embodiments, the socket electrical contacts 32 coupled to a second (bottom) surface of the socket 30 may further extend through the socket 30 and be electrically coupled to electrical contacts coupled to a test unit comprising of a printed circuit board, such as shown and described with respect to FIG. 8. This allows the test unit to supply electrical signals to the device, e.g., package substrate 28 and semiconducting material 26, to perform testing.

At block 106, adjustable portions of the socket 30 may optionally be mechanically adjusted to modify a size of a gap 36 (FIG. 2) between the socket 30 and the package substrate 28. In certain embodiments, if the tolerance of the socket to the device, e.g., package substrate 28, is not sufficiently tight to limit fluid leak rates to a reasonable level, then the adjustable portions of the socket may be manipulated to change the gap 36 size to improve those tolerances.

Figure 4:
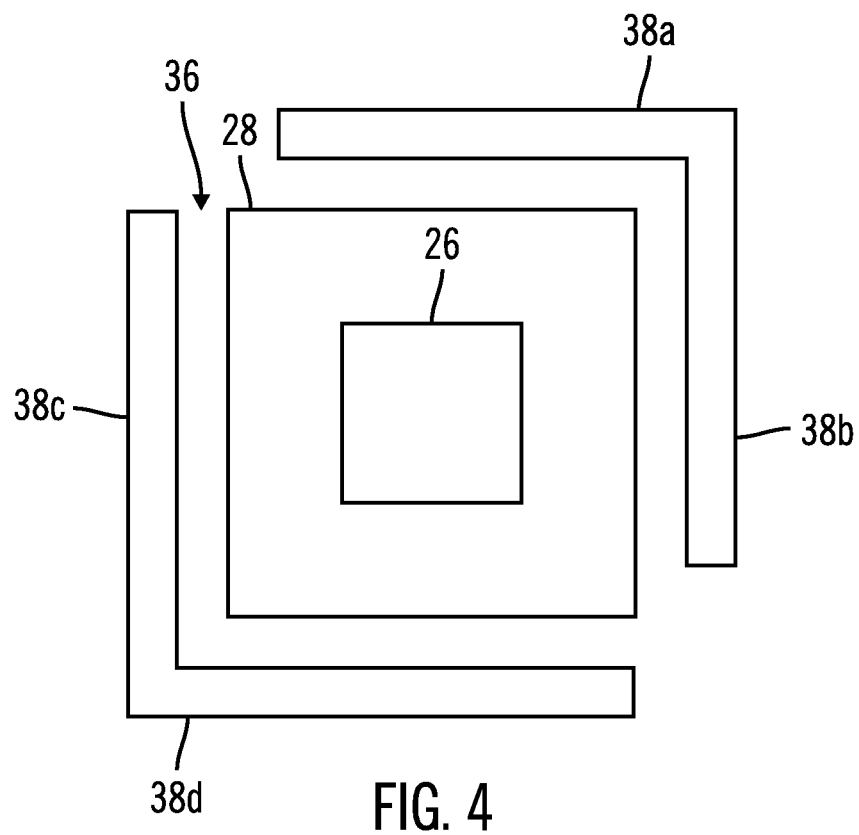

FIG. 4 illustrates an embodiment of an active socket design having two adjustable actuated (i.e., movable) sides 38a and 38b and two fixed sides 38c and 38d. The actuated (i.e., movable) sides 38a, 38b may be adjusted to provide the gap 36 between the socket 30 and the device, e.g., package substrate 28. The actuated sides 38a and 38b may be adjusted to increase or decrease a size of the gap 36 with respect to the fixed sides 38c, 38d. In certain testing scenarios, the device is placed into the socket 30 and the actuated sides 38a. 38b mechanically precise the device against the fixed sides 38c, 38d before the test begins. After testing is complete, the actuation of the actuated sides 38a, 38b is reversed to release the device.

In further embodiments, an inflatable seal element may be used to adjust the size of the gap 36 between the socket sides.

Figure 5:
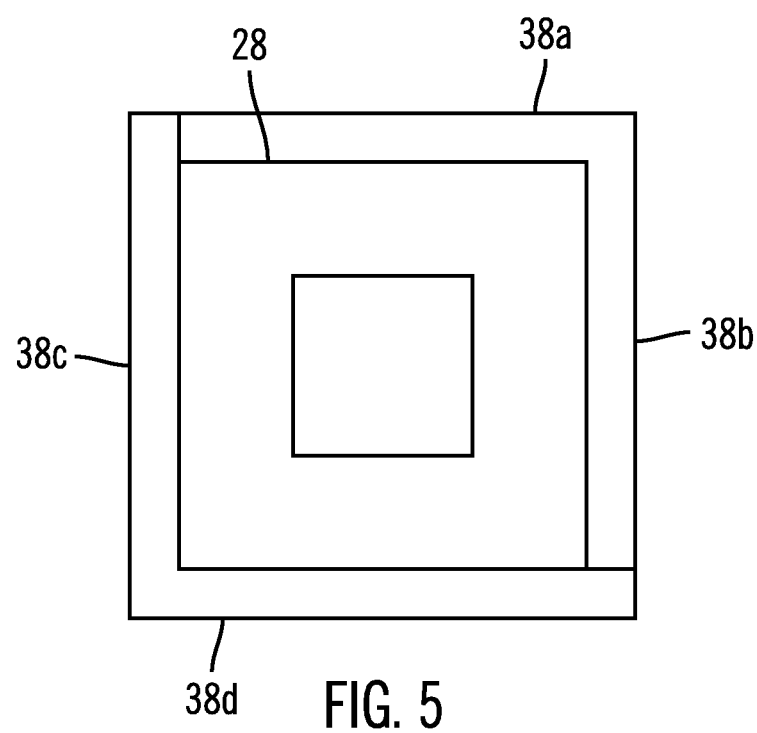

FIG. 5 illustrates a state where the actuated sides 38a and 38b are mechanically adjusted to abut the package substrate 28 to provide no opening.

The gap 36 provides fluid communication between a first chamber 42, defined in part by inner walls 44 of the body 22, the thermal head 24, the semiconducting material 26, and a top surface of the package substrate 28, and a second chamber 46, defined in part by the inner walls 48 of the socket 30 and a lower surface of the package substrate 28. The size of the gap 36 may in part control the flow of fluid 40 from the first chamber 42 into the second chamber 46. The size of the gap 36 may further control the downward pressure applied by the fluid 40 to the device, e.g., package substrate 28. The gap 36 enables a pressure differential to exist between the first chamber 42 and the second chamber 46. The pressure difference between the surfaces of the package substrate 28 applies a socketing load without mechanical contact to the device under test, or package substrate 28.

Returning to FIG. 2, at block 108, fluid 40 is delivered into the first chamber 42 (FIG. 3) through an opening 50 to a liquid channel 52 formed in the body 22. At block 110, the fluid 40 flow into the first chamber 42 is controlled to move the device to a seated position in the socket 30, where the fluid 40 flows from the first chamber 42 through the gap 36 to the second chamber 46 from where it is vented through vents 58 in the socket 30. The fluid 40 may comprise a liquid or gas to apply uniform downward pressure and force on the substrate 28 to move toward the bottom portion 48 of the socket 30. A liquid fluid 40 provides hydraulic downward pressure on the package substrate 28 and the semiconducting material 26 and a gas fluid 40 provides pneumatic downward pressure on the package substrate 28 and the semiconducting material 26.

The fluid 40 delivered to the first chamber 42 applies downward pressure on the device, e.g., package substrate 28 and the semiconducting material 26, to move the device though a plurality of intermediate states until the device reaches a final position seated within the socket chamber 46, above the bottom portion of the socket 28. In certain embodiments, in the seated position, there may be a small gap between the bottom surface of the device, e.g., package substrate 28, and bottom of the socket 30 or, in alternative embodiments, in the seated position, the bottom surface of the device, e.g., package substrate 28, may contact the lower portion of the socket 30.

In the case of hydraulically applied pressure, the fluid 40 can be applied in direct contact with the device. The fluid 40 can be a coolant that provides thermal device management. Coolant flow and temperature control would be designed to meet the particular thermal requirements needed for the device socketing application. It is understood that the fluid composition must maintain material compatibility with the device, socket, and other materials that the fluid 40 contacts. However, there are numerous examples of immersion cooling where inert liquids are indirect contact with printed circuit boards (PCBs), packaging, and both lidded and bare silicon devices. The liquid added may comprise suitable electronic fluids known in the art, such as FC3283.

At block 112, the thermal head 24 is thermally coupled to the device. In one embodiment, a first (bottom) surface of the thermal head 24 is thermally coupled to a first (upper) surface of the semiconducting material 26. A second (upper) surface of the thermal head 24 is coupled to the body 22. The thermal head 46 may be coupled to the body 22 in a manner to allow for independent movement of the thermal head 24 with respect to the body 22. In one embodiment, the thermal head 24 may be connected by springs to the body 22, such as shown and described with respect to FIG. 6. The springs may apply a mechanical force to thermally couple the thermal head 24 to the semiconductor material 26. The mechanical force applied to thermally couple the thermal head 24 to the device may be independent of the fluid pressure applied to move the device into the socket 30 to a seated position at bottom 48 of the socket 48. Further, as discussed, there may be the pedestal portion 25 located at the bottom of the thermal head 24 and positioned between the thermal head 24 and the device, e.g., semiconducting material 26, when the thermal head 24 is thermally coupled to the semiconducting material 26.

Figure 6:
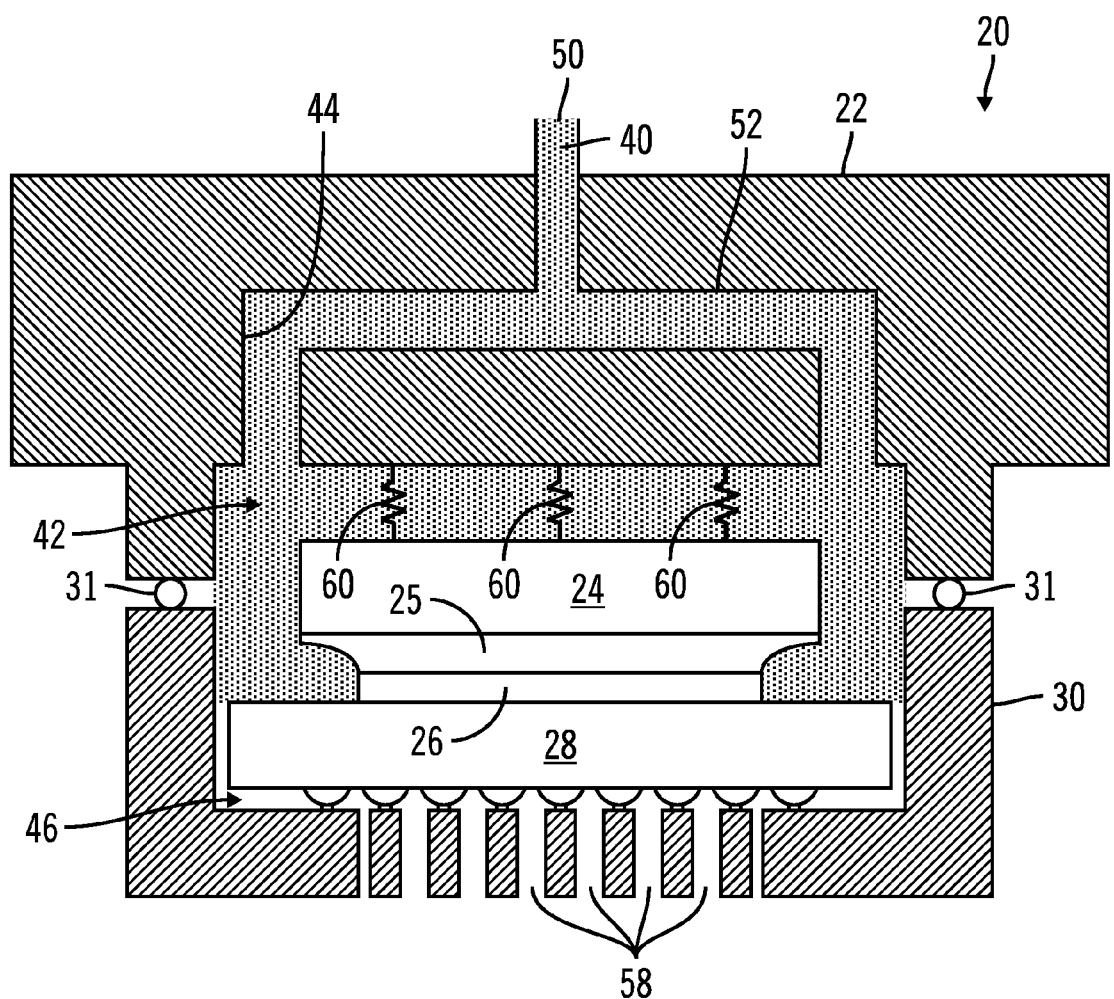

FIG. 6 shows an embodiment of the test unit 20 of FIG. 3 with an upper surface of the thermal head 24 connected via springs 60 to the body 22. Although three springs 60 are shown, there may be any number of springs or other connection mechanisms used to movably connect the thermal head 24 to the body 22 in a manner that allows the thermal head 24 to move independently of the body 22. A mechanical force may be applied through the springs 60 to thermally couple the thermal head 60 to the semiconducting material 24 when the package substrate 28 is at a seated position in the socket 28. The mechanical force applied to the springs 60 to move the thermal head 24 downward may be independent of the uniform downward force the fluid 40 applies to the package substrate 28.

In one embodiment, the thermal head 24 starts off in a retracted state (is not coupled to the semiconductor material 26) and does not engage until after the cavity is pressurized and the device, e.g., substrate 28 and semiconductor material 26, is fully seated at the bottom of the socket 48. Once the first chamber 42 is pressurized and the substrate 28 seated, the thermal head 24 may be engaged using a mechanism that lowers the thermal head 24 and provides a defined force against the semiconductor material 26. The springs 60 may represent different defined thermal head 24 force mechanisms, which are separate from the fluid force used to seat the substrate 28 in the socket. The spring mechanisms 60 for application of the thermal head 24 force of the springs 60 can be mechanical (such as a solenoid actuating a lever) or some other mechanism, such as a separate air pressure source driving a piston that lowers the thermal head 24 and pushes it down into the socket 46 with a defined force.

At block 114, the test unit 20 provides electronic signals to the device seated in the socket to test the device. The test unit 20 may include a printed circuit board electrically coupled to the socket 30, such as shown with respect to FIG. 8. In certain embodiments, the test unit 20 may provide electrical signals to the package substrate 28 and the semiconducting material 26 while the fluid is providing downward pressure onto the package substrate 28 in the seated position in the socket 30 to test operations of the semiconducting material 26.

Figure 7:
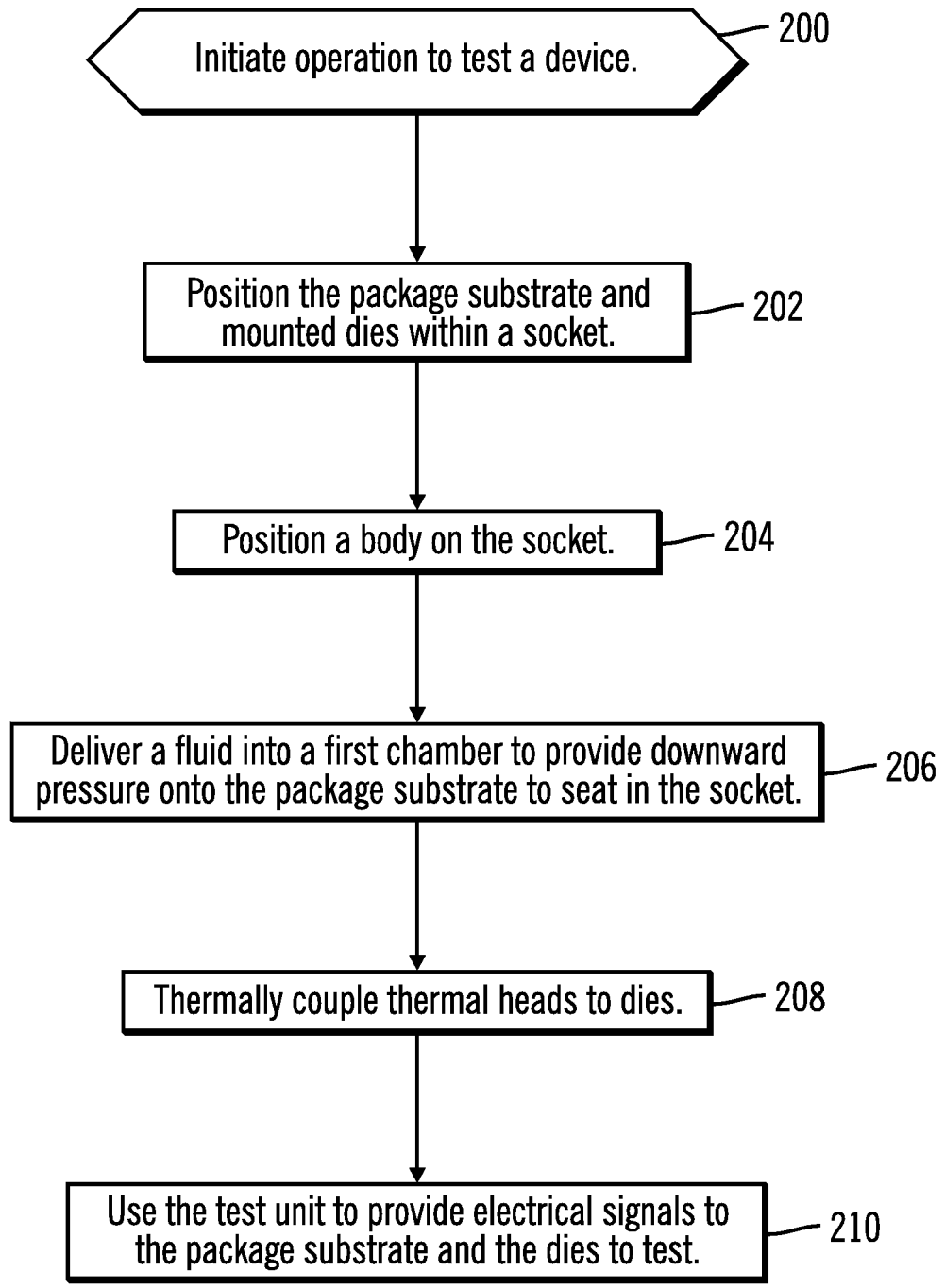

FIG. 7 illustrates a flow of operations to position a device, e.g., package substrate and semiconducting material, into a test unit for testing in accordance with described embodiments. The operations of FIG. 7 are described with respect to the device testing unit described with respect to FIG. 8. The operations described herein may be performed using semiconductor fabrication systems and machines known in the art comprised of a plurality of stations to perform the processing of the semiconductor devices as described herein.

With respect to FIG. 7, at block 200, the operations to test the device are initiated. FIG. 8 shows a cross section of a device testing unit 300 having a body 302 coupled to thermal heads 304a, 304b, 304c, each having thermal head. The thermal heads 304a, 304b, 304c may comprise copper and may be filled with a fluid for cooling dies 306a, 306b, 306c of semiconducting material 26, in which microelectronic devices are formed. The dies 306a, 306b, 306c may be mounted on a package substrate 308.

At block 202, the package substrate 308 and mounted dies 306a, 306b, 306c are positioned within socket 310. The positioning may allow for a gap 326 around the package substrate 308 between the package substrate 308 and the socket 310.

At block 204, the body 302 is positioned on the socket 308, where top surfaces of the thermal heads 304a, 304b, 304c are coupled to the body 302. A compressible material 314, such as an O-ring, may be coupled between the socket 310 and the package substrate 308 to provide an air tight cavity.

At block 206, a fluid 305, such as a gas or liquid, is delivered into a first chamber 335 defined in part by the body 302, the first (upper) surface of the package substrate 308, and the thermal heads 304a, 304b, 304c to provide uniform downward pressure onto the package substrate 308 to move the package substrate 308 and mounted dies 304a, 304b, 304c toward a bottom portion of the socket 310 to a seated position within the socket 310. The gap 326 between the package substrate 308 and the inner walls of the socket 310 allows fluid 305 to pass to a second chamber 330 between the socket 310 and the package substrate 308. Fluid 305 may exit through vents 328.

At block 208, each of a first (bottom) surfaces of the thermal heads 304a, 304b, 304c are thermally coupled to a top surface of each of the dies 306a, 306b, 306c. There may be a further material between each of the thermal heads 304a, 304b, 304c and the dies 306a, 306b, 306c. In certain embodiments, each die 306a, 306b, 306c may be thermally coupled to a different of the thermal heads 304a, 304b, 304c. In an alternative embodiment, multiple dies may be thermally coupled to one thermal head or multiple thermal heads may be thermally coupled to one die. The thermal heads 304a, 304b, 304c may be coupled to the body 302 in a manner to allow for independent movement of the thermal heads 304a, 304b, 304c with respect to the body 302. In one embodiment, the thermal heads 304a, 304b, 304c may be connected by springs to the body 302, such as described with respect to FIG. 6.

When the package substrate 308 is positioned in the socket 308, package electrical contacts 316 on a second (lower) surface of the package substrate 308 are electrically coupled to socket electrical contacts 318 that may extend through the socket 310 to electrically couple to a printed circuit board 324. In FIG. 8, the package electrical contacts 316 are shown as solder balls or metallic bumps formed on the bottom surface of the package substrate 308. In alternative embodiments, the package electrical contacts 316 may comprise other suitable structures known in the art such as contact pins. In FIG. 8, the socket electrical contacts 318 are shown as pins, and may comprise retractable pins that compress as the package electrical contacts 316 provide downward force on the portion of the pins between the printed circuit board 324 and the socket 310.

In certain embodiments, the socket electrical contacts 318 may extend through the socket 310 so that a portion 320 of the socket electrical contacts 318 are electrically coupled to electrical contacts 322 on the printed circuit board 324.

At block 210, the printed circuit board 324 of the test unit 300 tests the device. In one embodiment, the printed circuit board 324 may provide electrical signals to the package substrate 308 and the dies 306a, 306b, 306c via electrical contacts 316, 318, 320, and 322 to perform testing while the fluid 305 is providing downward pressure onto the package substrate 308 and the dies 306a, 306b, 306c to test operations of the dies 306a, 306b, 306c.

In certain embodiments, the bottom of the package may be maintained at a lower pressure than the topside. This may be accomplished by venting the back of the contact or so as to maintain the contact side of the package at or near ambient pressure. In the case of fluid, fluid would be introduced after sealing the socket chamber and may be evacuated from both above and below the device when testing is complete.

With the described embodiments, a device under test (DUT), such as a semiconductor die and package substrate, are positioned in a socket and a body is placed above the device and coupled to the socket. The device, e.g., DUT, may be a microprocessor, memory device, application specific integrated circuit (ASIC), Field Programmable Gate Array (FPGA), storage device or any type of electronic device that is mounted. Once the device is positioned in the socket, fluid is then delivered into to a chamber defined by the device, socket and body to provide downward pressure on the device to move to a seated position at a bottom portion of the socket so that the device may be tested while positioned in the socket by the pressure provided by the fluid.

The illustrated operations of the figures show certain events occurring in a certain order. In alternative embodiments, certain operations may be performed in a different order, modified or removed. Moreover, steps may be added to the above described logic and still conform to the described embodiments. Further, operations described herein may occur sequentially or certain operations may be processed in parallel. Yet further, operations may be performed by a single processing unit or by distributed processing units.

Terms such as "first", "second", and the like, may be used herein and do not necessarily denote any particular order, quantity, or importance, but are used to distinguish one element from another. Terms such as "top", bottom", "upper", "lower", and the like may be used for descriptive purposes only and are not to be construed as limiting. Embodiments may be manufactured, used, and contained in a variety of positions and orientations.

In the foregoing Detailed Description, various features are grouped together for the purpose of streamlining the disclosure. This method of disclosure is not to be interpreted as reflecting an intention that the claimed embodiments of the invention require more features than are expressly recited in each claim. Rather, as the following claims reflect, inventive subject matter may lie in less than all features of a single disclosed embodiment. Thus the following claims are hereby incorporated into the Detailed Description, with each claim standing on its own as a separate preferred embodiment.

While certain exemplary embodiments have been described above and shown in the accompanying drawings, it is to be understood that such embodiments are merely illustrative and not restrictive, and that embodiments are not restricted to the specific constructions and arrangements shown and described since modifications may occur to those having ordinary skill in the art.

What is claimed is:

1. A method comprising:
   positioning a device within a socket;
   positioning a body on the socket; and
   delivering a fluid into a chamber defined in part by the body and a first surface of the device to provide pressure onto the device to move the device within the socket, wherein the fluid is brought into direct contact with the device within the socket.

2. The method of claim 1, wherein the fluid comprises at least one of a liquid and a gas to apply uniform pressure to the device to move the device within the socket.

3. The method of claim 1, wherein the delivering the fluid into the chamber includes passing the fluid through a first opening defined in the body and passing the fluid through at least one second opening defined in the body.

4. The method of claim 1, further comprising:
   electrically coupling a printed circuit board to the device; and
   using the printed circuit board to provide electrical signals to the device to test operations of the device while the fluid is providing pressure onto the device in the socket.

5. The method of claim 1, wherein the chamber comprises a first chamber, wherein delivering the fluid comprises:
   controlling a flow of the fluid to apply pressure on the device to move toward a bottom portion of the socket to reach a position where the device has reached a seated position in the socket.

6. The method of claim 1, further comprising:
   thermally coupling a first surface of a thermal head to the first surface of the device when the device is moved to a seated position in the socket by the pressure of the fluid; and
   coupling a second surface of the thermal head to the body.

7. The method of claim 6, wherein the first surface of the thermal head includes a plurality of contact regions, wherein each of the contact regions are coupled to a different portion of the device, and wherein the pressure of the fluid moves the device toward a bottom portion of the socket.

8. A method comprising:
   positioning a device within a socket;
   positioning a body on the socket;
   delivering a fluid into a first chamber defined in part by the body and a first surface of the device to provide pressure onto the device to move the device within the socket; and
   controlling the delivering the fluid into the first chamber to cause the fluid to flow through a gap between a wall of the socket and the device, into a second chamber defined by the socket and a second surface of the device.

9. The method of claim 8, further comprising:
   venting the fluid from the second chamber through at least one vent opening in the socket.

10. The method of claim 8, wherein the socket comprises a movable portion and fixed portion, wherein the gap is formed between ends of the movable portion and the fixed portion, further comprising:
    adjusting the movable portion of the socket relative to the fixed portion to adjust a size of the gap.

11. The method of claim 8, further comprising:
    electrically coupling a printed circuit board to the device; and
    using the printed circuit board to provide electrical signals to the device to test operations of the device while the fluid is providing pressure onto the device in the socket.

12. The method of claim 8, further comprising:
    thermally coupling a first surface of a thermal head to the first surface of the device when the device is moved to a seated position in the socket by the pressure of the fluid; and
    coupling a second surface of the thermal head to the body.

13. A system for using fluid in testing a device, comprising:
    a body;
    a socket coupled to the body, wherein the socket has a bottom portion for receiving the device;
    a first chamber defined in part by the body, a first surface of the device, and the socket;
    an opening in fluid communication with the first chamber, wherein the fluid is delivered into the first chamber through the opening to provide pressure onto the device to move the device within the socket;
    a gap between a wall of the socket and the device positioned in the socket; and
    a second chamber defined in part by the socket and the device, wherein the second chamber is in fluid communication with the first chamber through the gap.

14. The system of claim 13, further comprising:
    at least one vent opening formed in the socket for venting the fluid from the second chamber.

15. The system of claim 13, wherein the socket comprises a movable portion and fixed portion, wherein the gap is formed between ends of the movable portion and the fixed portion, and wherein the movable portion is adjusted relative to the fixed portion to adjust a size of the opening.

16. The system of claim 13, further comprising:
    a test unit electrically coupled to the socket to provide electrical signals to the device while the fluid is providing pressure onto the device to test operations of the device.

17. The system of claim 13, further comprising:
- a thermal head having a first surface coupled to the first surface of the device when the device is moved to a seated position in the socket by the pressure of the fluid; and
- a second surface of the thermal head coupled to the body.

18. The system of claim 17, wherein the first surface of the thermal head includes a plurality of contact regions, wherein each of the contact regions are coupled to different portions of the device, and wherein the pressure of the fluid moves the device toward the bottom portion of the socket.

19. A method comprising:
- positioning a device within a socket;
- positioning a body on the socket;
- positioning a thermal head in thermal communication with the device;
- delivering a fluid into a chamber defined in part by a surface of the device to provide pressure onto the surface of the device to seat the device within the socket, wherein the fluid is brought into direct contact with the surface of the device; and
- after the device is seated within the socket, electrically testing the device.

20. The method of claim 19, wherein the fluid comprises a gas.

21. The method of claim 19, wherein the fluid comprises a liquid.

22. The method of claim 19, wherein the device comprises a package substrate and a semiconductor die positioned on the package substrate, and wherein the surface comprises a portion of the package substrate.

\* \* \* \* \*